United States Patent
Nakashima

(10) Patent No.: US 12,401,138 B2
(45) Date of Patent: Aug. 26, 2025

(54) SEMICONDUCTOR DEVICE

(71) Applicant: Sumitomo Electric Device Innovations, Inc., Yokohama (JP)

(72) Inventor: Ikuo Nakashima, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 468 days.

(21) Appl. No.: 17/924,874

(22) PCT Filed: May 12, 2021

(86) PCT No.: PCT/JP2021/018059
§ 371 (c)(1),
(2) Date: Nov. 11, 2022

(87) PCT Pub. No.: WO2021/230289
PCT Pub. Date: Nov. 18, 2021

(65) Prior Publication Data
US 2023/0198169 A1 Jun. 22, 2023

(30) Foreign Application Priority Data
May 14, 2020 (JP) ................. 2020-085445

(51) Int. Cl.
*H01L 23/057* (2006.01)
*H01L 23/12* (2006.01)
(Continued)

(52) U.S. Cl.
CPC ............ *H01Q 23/00* (2013.01); *H01L 23/66* (2013.01); *H01L 2223/6627* (2013.01)

(58) Field of Classification Search
CPC ....... H01L 23/66; H01L 23/057; H01L 23/12; H01Q 23/00; H01P 5/02
See application file for complete search history.

(56) References Cited

U.S. PATENT DOCUMENTS

| | | | |
|---|---|---|---|
| 5,184,095 A * | 2/1993 | Hanz ................. | H01L 23/64 333/33 |
| 2011/0204976 A1* | 8/2011 | Masuda ............. | H01L 23/66 330/195 |

(Continued)

FOREIGN PATENT DOCUMENTS

| | | |
|---|---|---|
| JP | 63-86904 A | 4/1988 |
| JP | 05-235612 A | 9/1993 |

(Continued)

*Primary Examiner* — Omar F Mojaddedi
(74) *Attorney, Agent, or Firm* — Volpe Koenig

(57) ABSTRACT

A semiconductor device includes a base, a matching circuit including a substrate, a ground layer, and a signal line, wherein a width of the signal line on a first end side of the substrate is smaller than a width of the substrate and larger than that of the signal line on a second end side, and a distance between the ground layer and the signal line on the first end side is larger than a distance therebetween on the second end side, a semiconductor element electrically connected to the signal line on the first end side of the matching circuit by first bonding wires, a frame body, a feedthrough having a lead, and second bonding wires electrically connected to the lead and the signal line on the second end side, wherein the first bonding wires are arranged in parallel, and the second bonding wires are arranged in parallel.

9 Claims, 6 Drawing Sheets

(51) Int. Cl.
    *H01L 23/66*     (2006.01)
    *H01P 5/02*     (2006.01)
    *H01Q 23/00*     (2006.01)

(56) References Cited

U.S. PATENT DOCUMENTS

| | | | |
|---|---|---|---|
| 2017/0162525 A1* | 6/2017 | Takagi | H01L 25/16 |
| 2017/0338194 A1* | 11/2017 | Gittemeier | H01L 23/057 |
| 2018/0019194 A1* | 1/2018 | Papillon | H01L 23/49816 |
| 2019/0019767 A1* | 1/2019 | Ishibashi | H01L 23/5389 |
| 2021/0028132 A1* | 1/2021 | Hirayama | H01L 23/49838 |

FOREIGN PATENT DOCUMENTS

| | | |
|---|---|---|
| JP | 09-051209 A | 2/1997 |
| JP | 11-003904 A | 1/1999 |
| JP | 2013-235913 A | 11/2013 |
| JP | 2019-161205 A | 9/2019 |

\* cited by examiner

SEMICONDUCTOR DEVICE

TECHNICAL FIELD

The present disclosure relates to a semiconductor device.

BACKGROUND ART

A device that amplifies a high-frequency signal includes a semiconductor element such as a transistor, and a transmission component that transmits the high-frequency signal (PTL 1). The transmission component has a transmission line such as a microstrip line.

CITATION LIST

Patent Literature

PTL 1: Japanese Laid-open Patent Publication No. 63-86904

SUMMARY OF INVENTION

Technical Problem

A characteristic impedance on one end side of the transmission component may differ from a characteristic impedance on the other end side. The change of the impedance increases the loss of the high frequency signal. Therefore, it is an object of the present disclosure to provide a semiconductor device capable of suppressing a change in characteristic impedance.

Solution to Problem

A semiconductor device according to the present disclosure includes a base; a matching circuit including: a rectangular substrate provided on the base and including an insulator; a ground layer provided on the substrate; a signal line provided on a first surface of the substrate and separated from the ground layer; wherein a width of the signal line on a first end side of the substrate is smaller than a width of the substrate and larger than a width of the signal line on a second end side of the substrate, and a distance between the ground layer and the signal line on the first end side is larger than a distance between the ground layer and the signal line on the second end side, a semiconductor element provided on the base and electrically connected to the signal line on the first end side of the matching circuit by a plurality of first bonding wires, a frame body provided on the base and surrounding the semiconductor element and the matching circuit; a feedthrough provided on the frame body and having a lead; and a plurality of second bonding wires electrically connected to the lead of the feedthrough and the signal line on the second end side of the matching circuit; wherein the plurality of first bonding wires are arranged in parallel with each other, and the plurality of second bonding wires are arranged in parallel with each other.

A semiconductor device according to the present disclosure includes a base, a semiconductor element provided on a base; a feedthrough provided on a frame body and having a ground layer, and a lead provided on a signal line; wherein the semiconductor element is electrically connected to the signal line through the lead by a plurality of first bonding wires, a width of the signal line on a semiconductor element side is larger than a width of the signal line on an opposite side of the semiconductor element side, a distance between the ground layer and the signal line on the semiconductor element side is larger than a distance between the ground layer and the signal line on the opposite side of the semiconductor element side, and the lengths of the plurality of first bonding wires are the same as each other.

According to the present disclosure, it is possible to suppress a change in characteristic impedance.

DESCRIPTION OF EMBODIMENTS

Description of Embodiments of Present Disclosure

Figure 1A:
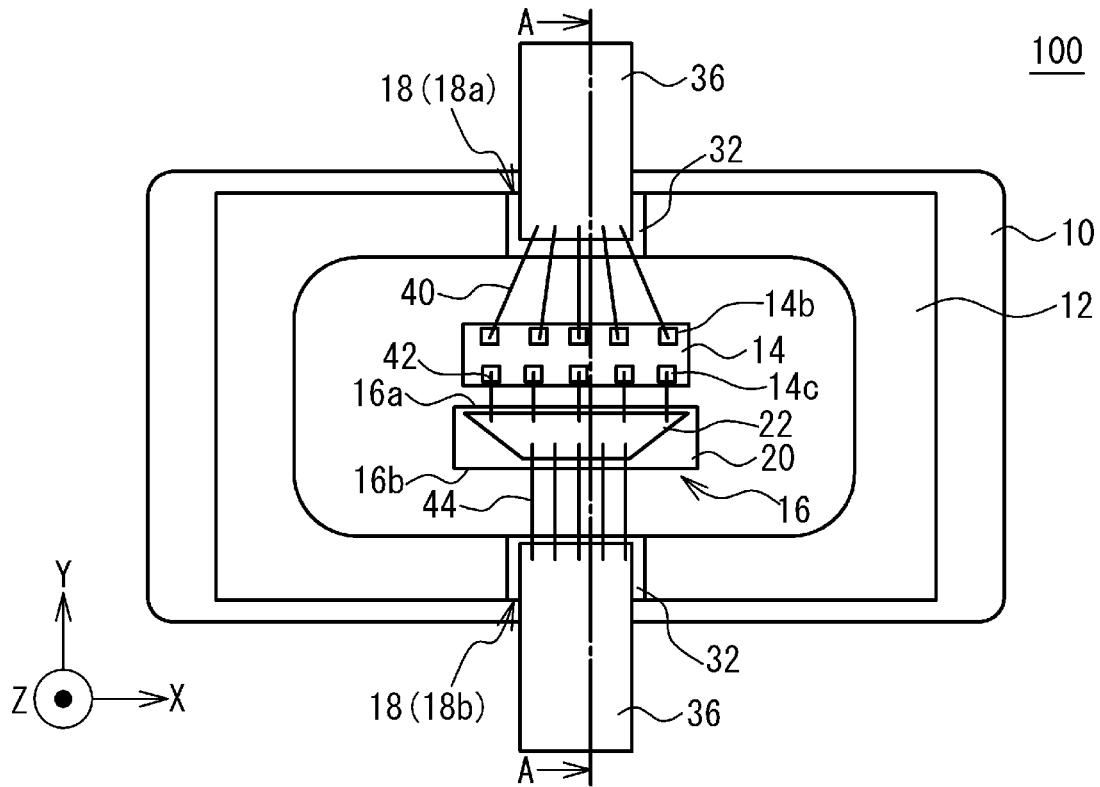
FIG. 1A is a plan view illustrating a semiconductor device according to a first embodiment.

First, embodiments of the present disclosure will be listed and described.

An aspect of the present disclosure is (1) a semiconductor device including a base, a matching circuit including a rectangular substrate provided on the base and including an insulator, a ground layer provided on the substrate; a signal line provided on a first surface of the substrate and separated from the ground layer; wherein a width of the signal line on a first end side of the substrate is smaller than a width of the substrate and larger than a width of the signal line on a second end side of the substrate, and a distance between the ground layer and the signal line on the first end side is larger than a distance between the ground layer and the signal line on the second end side, a semiconductor element provided on the base and electrically connected to the signal line on the first end side of the matching circuit by a plurality of first bonding wires, a frame body provided on the base and surrounding the semiconductor element and the matching circuit, a feedthrough provided on the frame body and having a lead, and a plurality of second bonding wires electrically connected to the lead of the feedthrough and the signal line on the second end side of the matching circuit, wherein the plurality of first bonding wires are arranged in parallel with each other, and the plurality of second bonding wires are arranged in parallel with each other. A characteristic impedance of the matching circuit on the one end side becomes equal to a characteristic impedance on the other end side. Therefore, the loss of the high frequency signal propagating through the matching circuit is suppressed.

(2) The ground layer may be provided on a second surface of the substrate which is located on an opposite side of the first surface. The characteristic impedance of the matching circuit on the one end side becomes equal to the characteristic impedance on the other end side. Therefore, the loss of the high frequency signal propagating through the matching circuit is suppressed.

(3) The second surface of the substrate may be inclined to approach the first surface from the first end side of the substrate to the second end side of the substrate. The characteristic impedance of the matching circuit on the one end side becomes equal to the characteristic impedance on the other end side. Therefore, the loss of the high frequency signal propagating through the matching circuit is suppressed.

(4) The second surface of the substrate may have a step that approaches the first surface from the first end side of the substrate to the second end side of the substrate. The characteristic impedance of the matching circuit on the one end side becomes equal to the characteristic impedance on the other end side. Therefore, the loss of the high frequency signal propagating through the matching circuit is suppressed.

(5) The substrate may include a plurality of stacked insulator layers. The ground layer may include a first metal layer provided on a second surface of the substrate which is located on an opposite side of the first surface, and a second metal layer provided between the plurality of insulator layers. An end portion of the second metal layer on the first end side of the substrate may be located closer to the second end side of the substrate than an end portion of the first metal layer on the first end side of the substrate. The characteristic impedance of the matching circuit on the one end side becomes equal to the characteristic impedance on the other end side. Therefore, the loss of the high frequency signal propagating through the matching circuit is suppressed.

(6) The ground layer may include a plurality of stacked second metal layers. An end portion of one of the second metal layers on the first end side of the substrate may be located closer to the second end of the substrate than an end portion of another one of the second metal layers on the first end side of the substrate. The one of the second metal layers may be closer to the signal line in a stacking direction of the plurality of insulator layers. The another one of the second metal layers may be farther from the signal line in the stacking direction. The characteristic impedance of the matching circuit on the one end side becomes equal to the characteristic impedance on the other end side. Therefore, the loss of the high frequency signal propagating through the matching circuit is suppressed.

(7) An interval between the plurality of first bonding wires may be wider than an interval between the plurality of second bonding wires.

(8) The lengths of the plurality of first bonding wires may be the same as each other, and the lengths of the plurality of second bonding wires may be the same as each other.

(9) The semiconductor device includes a semiconductor element provided on a base, a feedthrough provided on a frame body and having a ground layer, and a lead provided on a signal line, wherein the semiconductor element is electrically connected to the signal line through the lead by a plurality of first bonding wires, a width of the signal line on a semiconductor element side is larger than a width of the signal line on an opposite side of the semiconductor element side, a distance between the ground layer and the signal line on the semiconductor element side is larger than a distance between the ground layer and the signal line on the opposite side of the semiconductor element side, and the lengths of the plurality of first bonding wires are the same as each other. The characteristic impedance of the matching circuit on the one end side becomes equal to the characteristic impedance on the other end side. Therefore, the loss of the high frequency signal propagating through the matching circuit is suppressed.

Details of Embodiments of Present Disclosure

Specific examples of a semiconductor device according to an embodiment of the present disclosure will be described below with reference to the drawings. It should be noted that the present disclosure is not limited to these examples, and is defined by Claims, and is intended to embrace all the modifications within the meaning and range of equivalency of the Claims.

First Embodiment (Semiconductor Device)

Figure 1B:
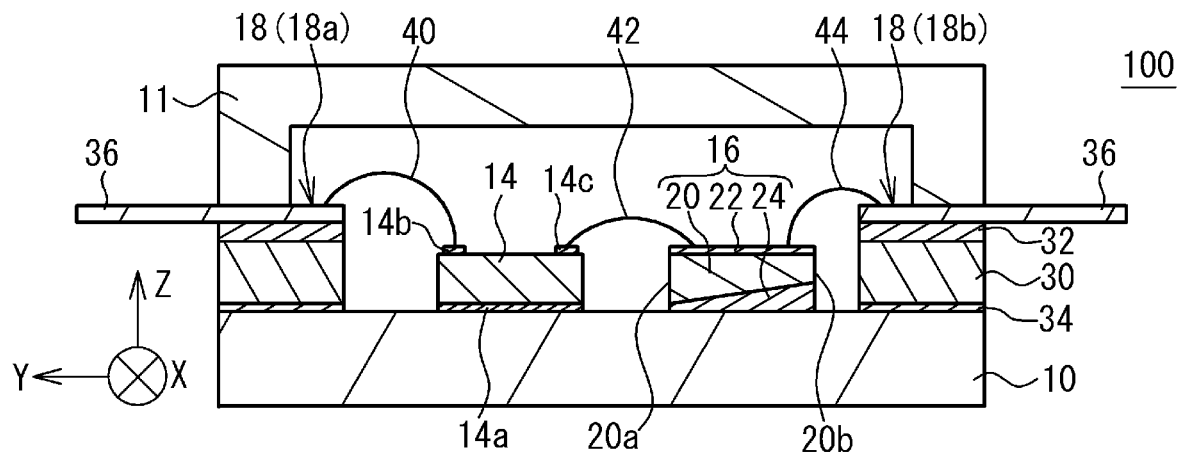
FIG. 1B is a cross-sectional view taken along a line A-A of FIG. 1A.

FIG. 1A is a plan view illustrating a semiconductor device 100 according to a first embodiment. In FIG. 1A, a lid 11 described later is transparent. FIG. 1B is a cross-sectional view taken along a line A-A of FIG. 1A.

The semiconductor device 100 includes a base 10, the lid 11, a frame body 12, a transistor 14 (a semiconductor element), a matching circuit component 16, and a feedthrough 18. The base 10 is made of, for example, a stack of molybdenum/copper/molybdenum (Mo/Cu/Mo) and a metal such as a gold (Au) plating layer provided on a surface of the stack, and has a reference potential (ground potential). Sides of the base 10 extend in an X-axis direction and a Y-axis direction. A Z-axis direction is perpendicular to a top surface of the base 10. The X-axis direction, the Y-axis direction, and the Z-axis direction are orthogonal to each other.

The frame body 12 is a ring-shaped member, and is made of an insulator such as ceramic. The transistor 14 and the matching circuit component 16 are arranged on an upper surface of the base 10 at a position surrounded by the frame body 12. Two openings are provided on both sides of the frame body 12 in the Y-axis direction, and feedthroughs 18 are attached to the two openings, respectively. Among the two feedthroughs 18, one on the transistor 14 side is referred to as a feedthrough 18a, and the other on the matching circuit component 16 side is referred to as a feedthrough 18b. The feedthrough 18a, the transistor 14, the matching circuit component 16 and the feedthrough 18b are arranged in this order from an upper side of FIG. 1A along the Y-axis direction.

The lid 11 is attached to the upper surface of the frame body 12. The lid 11, the frame body 12, and the feedthroughs 18 hermetically seal the transistor 14 and the matching circuit component 16. The lid 11 is made of metal such as Kovar, or ceramic. If the transistor 14 has a high moisture resistance, it does not have to be hermetically sealed. In this case, the lid 11 is made of an insulator such as ceramic or plastic.

The transistor 14 is a semiconductor element including, for example, a field effect transistor (FET) using a nitride semiconductor. As illustrated in FIG. 1B, the transistor 14 has pads 14a, 14b and 14c. The pad 14a is, for example, a source pad, and is provided on a surface on the base 10 side of the transistor 14. The pads 14b and 14c are provided on a surface on the lid 11 side of the transistor 14. The pad 14b is, for example, a gate pad. The pad 14c is, for example, a drain pad. A width of the transistor 14 in a longitudinal direction is preferably large for high output, and is larger than a width of a signal line 32 in the feedthrough 18, for example.

The matching circuit component 16 has a substrate 20, a signal line 22, and a metal layer 24, functions as a capacitor, and matches impedances between the transistor 14 and the feedthrough 18b. The substrate 20 is, for example, an insulating substrate made of ceramic such as aluminum oxide ($Al_2O_3$) and barium titanate ($BaTIO_3$), and is a substrate including an insulator. The signal line 22 and the metal layer 24 are made of, for example, metals such as copper (Cu), molybdenum (Mo) and tungsten (W), and alloys containing these metals. The signal line 22 is provided on an upper surface of the substrate 20. The metal layer 24 is a ground layer provided on a lower surface of the substrate 20, separated from the signal line 22, and electrically connected to the upper surface of the base 10. The substrate 20, the signal line 22, and the metal layer 24 form a microstrip line that propagates a high frequency signal. An end surface on the transistor 14 side of the substrate 20 is referred to as a surface 20a, and an end surface on the feedthrough 18b side of the substrate 20 is referred to as a surface 20b.

Figure 2A:
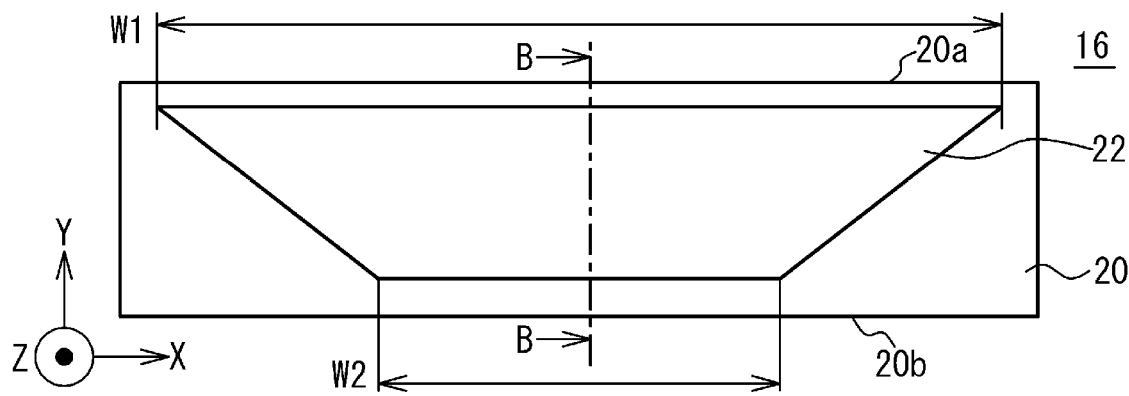
FIG. 2A is an enlarged plan view of a matching circuit component.

FIG. 2A is an enlarged plan view of the matching circuit component 16. As illustrated in FIG. 2A, a planar shape of the signal line 22 is trapezoidal. A width W1 on the surface 20a side of the signal line 22 is larger than a width W2 on the surface 20b side. The width W1 is, for example, 4 mm, and the width W2 is, for example, 2 mm. The width of the signal line 22 is continuously reduced from the surface 20a to the surface 20b. The width W1 is, for example, 1.1 times or more, 1.5 times or more, 2 times or more, or 3 times or more, or the like of the width W2.

Figure 2B:
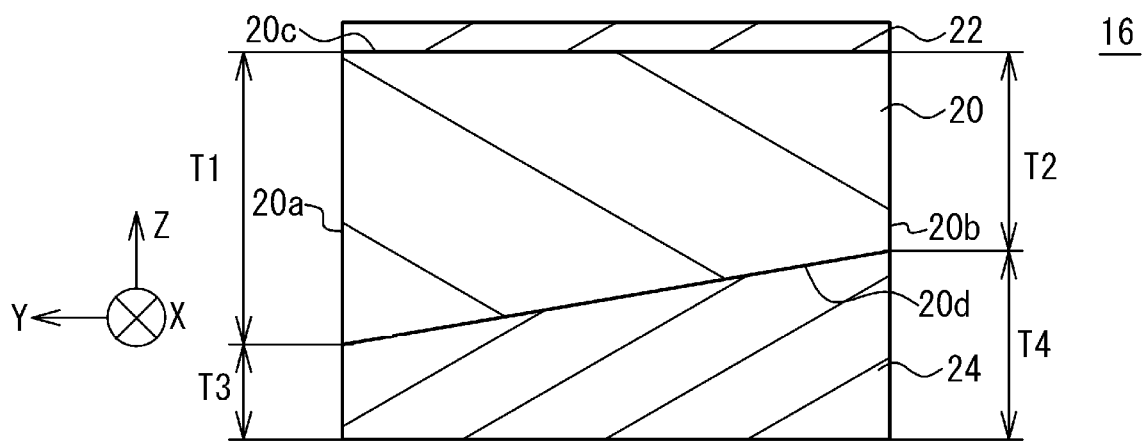
FIG. 2B is a cross-sectional view taken along a line B-B of FIG. 2A.

FIG. 2B is a cross-sectional view taken along a line B-B of FIG. 2A. As illustrated in FIG. 2B, the signal line 22 and the metal layer 24 extend in the Y-axis direction from the surface 20a of the substrate 20 to the surface 20b. An upper surface 20c (first surface) of the substrate 20 and a lower surface of the metal layer 24 are parallel to the upper surface of the base 10 and extend in an XY plane. A lower surface 20d (second surface) of the substrate 20 is inclined with respect to the surface 20c of the substrate 20, and approaches the surface 20c from the surface 20a side to the surface 20b side. That is, the substrate 20 is continuously thinned from the surface 20a side to the surface 20b side. A thickness T1 on the surface 20a side of the substrate 20 is larger than a thickness T2 on the surface 20b side. The thickness T1 is, for example, 0.5 mm, and the thickness T2 is, for example, 0.25 mm. The thickness T1 is, for example, 1.1 times or more, 1.5 times or more, 2 times or more, 3 times or more, or the like of the thickness T2.

An upper surface of the metal layer 24 is inclined with respect to a lower surface of the metal layer 24. A thickness T3 on the surface 20a side of the metal layer 24 is larger than a thickness T4 on the surface 20b side. The thickness T3 is, for example, 0.1 mm, and the thickness T4 is, for example, 0.35 mm. The total of the thickness of the substrate 20 and the thickness of the metal layer 24 is constant from the surface 20a side to the surface 20b side.

As illustrated in FIG. 1B, the feedthrough 18 is a transmission component having a substrate 30, the signal line 32, a metal layer 34, and a lead 36, and propagating a high frequency signal. The substrate 30 is, for example, an insulating substrate made of ceramic. The shape of the substrate 30 is rectangular. Upper and lower surfaces of the substrate 30 are parallel to the upper surface of the base 10 and extend in the XY plane. The metal layer 34 is a ground layer provided on the lower surface of the substrate 30 and electrically connected to the upper surface of the base 10. The signal line 32 and the metal layer 34 are made of, for example, metals such as Cu, Au, nickel (Ni) and titanium (Ti), and alloys containing these metals. The signal line 32 is formed on the upper surface of the substrate 30 by using, for example, sputtering and vapor deposition. The substrate 30, the signal line 32, and the metal layer 34 form a microstrip line. The lead 36 is made of metal, for example, is provided on an upper surface of the signal line 32, extends in the Y-axis direction, and protrudes to the outside of the base 10.

The pad 14a of the transistor 14 is arranged on the surface of the base 10 and is electrically connected to the base 10. The lead 36 of the feedthrough 18a and the pad 14b of the transistor 14 are electrically connected by a plurality of bonding wires 40. The pad 14c of the transistor 14 and the signal line 22 of the matching circuit component 16 are electrically connected by a plurality of bonding wires 42. The signal line 22 and the lead 36 of the feedthrough 18b are electrically connected by a plurality of bonding wires 44. The plurality of bonding wires 42 and 44 extend in the Y-axis direction. The lengths of the plurality of bonding wires 42 are equal to each other. The lengths of the plurality of bonding wires 44 are equal to each other. The bonding wires 40, 42 and 44 are made of metals such as Au, Al and Cu.

A high frequency signal having a frequency of, for example, 2 GHz is input from the lead 36 of the feedthrough 18a, amplified by the transistor 14, is input to the feedthrough 18b through the matching circuit component 16, and is output to the outside of the semiconductor device 100 through the lead 36 of the feedthrough 18b. The feedthrough 18b may be an input side and the feedthrough 18a may be an output side.

In order to suppress the loss of the high frequency signal, impedance matching is performed between the feedthrough 18a and the transistor 14, and impedance matching is performed between the transistor 14 and the feedthrough 18b. The matching circuit component 16 is a component for the impedance matching between the transistor 14 and the feedthrough 18b. For example, the matching circuit component 16 functions as a capacitor, and the bonding wires 44 function as an inductor.

The microstrip line is formed on the matching circuit component 16 and the feedthrough 18. The characteristic impedance of the microstrip line is determined by the width of the signal line and the thickness of the substrate (distance between the signal line and the ground layer). The wider the signal line, the lower the characteristic impedance, and the narrower the width, the higher the characteristic impedance. The larger the thickness of the substrate, the higher the characteristic impedance, and the smaller the thickness, the lower the characteristic impedance.

The width of the signal line 32 of the feedthrough 18 is constant from one end to the other end in the Y-axis direction. A distance between the signal line 32 and the metal layer 34 in the feedthrough 18 in the Z-axis direction is constant. Therefore, the characteristic impedance on the transistor 14 side of the feedthrough 18 is equal to the characteristic impedance on the opposite side (a tip of the lead 36).

The width of the signal line 22 of the matching circuit component 16 decreases from the surface 20a side to the surface 20b side. A distance between the signal line 22 and the metal layer 24 decreases from the surface 20a side to the surface 20b side. Therefore, the characteristic impedance on the surface 20a side of the matching circuit component 16 is substantially the same as the characteristic impedance on the surface 20b side.

Figure 3:
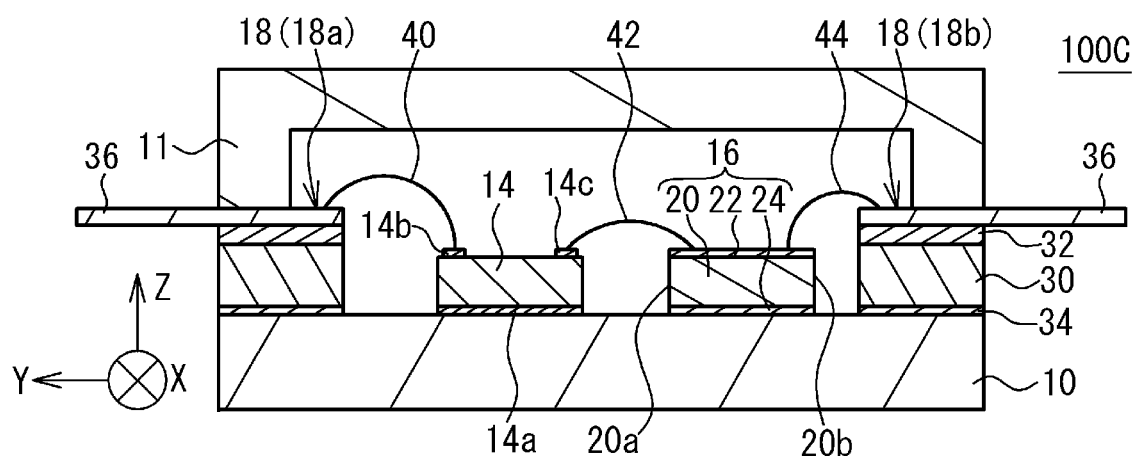
FIG. 3 is a plan view illustrating the semiconductor device according to a first comparative example.

FIG. 3 is a plan view illustrating a semiconductor device 100C according to a first comparative example. The description of the same configuration as that of the semiconductor device 100 will be omitted. As illustrated in FIG. 3, the lower surface of the substrate 20 of the matching circuit component 16 is not inclined, and the metal layer 24 is also not inclined. The thickness of the substrate 20 is constant from the surface 20a side to the surface 20b side. On the other hand, the width of the signal line 22 changes between the surface 20a side and the surface 20b side, as in the example of FIG. 2a. The characteristic impedance of the matching circuit component 16 changes due to the change in the width of the signal line 22. A characteristic impedance Za on the surface 20a side is lower than a characteristic impedance Zb on the surface 20b side, and impedance conversion is performed between the surface 20a side and the surface 20b side. This increases the loss of the high frequency signal propagating through the matching circuit component 16. For example, impedance mismatch occurs between the matching circuit component 16 and the feedthrough 18b, resulting in loss of the high frequency signal.

According to the first embodiment, the substrate 20, the signal line 22 and the metal layer 24 of the matching circuit component 16 form the microstrip line. As illustrated in FIG. 2A, the width W1 on the surface 20a side of the signal line 22 is larger than the width W2 on the surface 20b side. As illustrated in FIG. 2B, a distance T1 between the signal line 22 and the metal layer 24 on the surface 20a side (thickness of the substrate 20) is larger than a distance T2 on the surface 20b side. Thereby, the characteristic impedance Za on the surface 20a side of the microstrip line is substantially the same as the characteristic impedance Zb on the surface 20b side. The impedance conversion between the surface 20a side and the surface 20b side is suppressed, so that the loss of the high frequency signal is suppressed.

The characteristic impedance Za and the characteristic impedance Zb may be exactly the same or very close to each other. For example, the substrate 20 is formed of $Al_2O_3$ having a relative permittivity of 9.8, and the width W1 is 4 mm, the width W2 is 2 mm, the thickness T1 is 0.5 mm, and the thickness T2 is 0.25 mm. The characteristic impedance Za is 12.11Ω, and the characteristic impedance Zb is 12.10Ω. A difference between the characteristic impedance Za and the characteristic impedance Zb is, for example, 10% or less, 5% or less, 1% or less, or 0.5% or less of the characteristic impedance Za.

As illustrated in FIG. 2A, the width of the signal line 22 is continuously reduced from the surface 20a side to the surface 20b side. As illustrated in FIG. 2B, the lower surface 20d of the substrate 20 is inclined to gradually approach the upper surface 20c from the surface 20a side to the surface 20b. That is, the distance between the signal line 22 and the metal layer 24 (the thickness of the substrate 20) decreases continuously from the surface 20a side to the surface 20b. The width of the signal line 22 and the thickness of the substrate 20 are continuously changed, so that the characteristic impedance is substantially constant from the surface 20a side to the surface 20b side. The transmission line can be formed such that the characteristic impedance is not changed, and hence the loss of high frequency signals is suppressed.

It is preferable to increase the width of the transistor 14 in order to increase the output. As the width increases, the width W1 of the signal line 22 of the matching circuit component 16 also increases. On the other hand, the width W2 of the signal line 22 is smaller than the width W1 in accordance with the width of the signal line 32 of the feedthrough 18. That is, the signal line 22 is not rectangular but trapezoidal, and the width W1 and the width W2 are different from each other. The signal line 22 and the transistor 14 are connected to each other by the bonding wires 42. The signal line 22 and the feedthrough 18 are connected to each other by the bonding wires 44.

The plurality of bonding wires 42 and the plurality of bonding wires 44 extend in the Y-axis direction. The lengths of the plurality of bonding wires 42 are equal to each other, and the impedances of the plurality of bonding wires 42 are equal to each other. The lengths of the plurality of bonding wires 44 are equal to each other, and the impedances of the plurality of bonding wires 44 are equal to each other. Therefore, a phase shift between the high frequency signals is suppressed.

The matching circuit component 16 may include a transmission line other than the microstrip line. For example, a strip line may be provided. The matching circuit component 16 includes the substrate and the metal layer (ground layer) on the signal line 22. By changing the thickness of at least one of the upper and lower substrates on the surface 20a side and the surface 20b side, the characteristic impedances are made equal.

(First Variation)

Figure 4A:
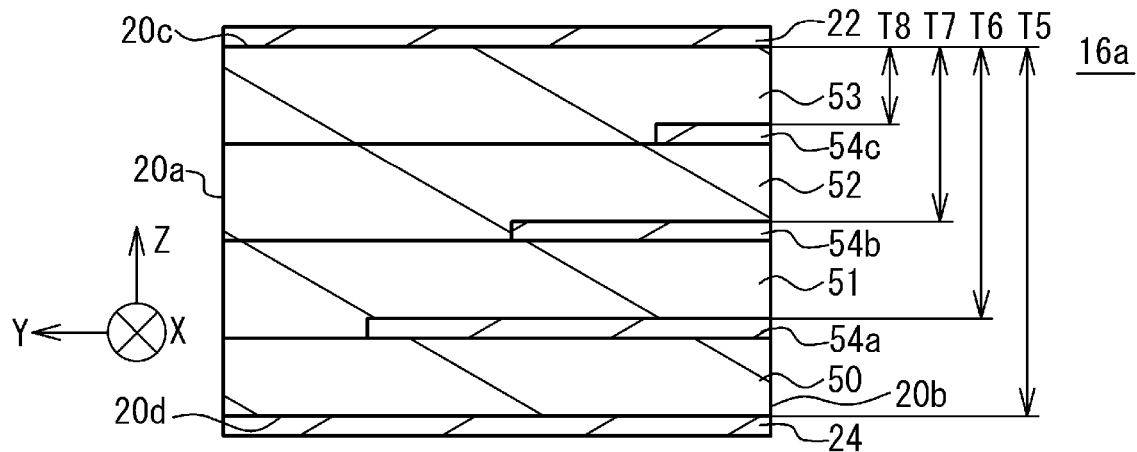
FIG. 4A is a cross-sectional view illustrating the matching circuit component according to a first variation.

FIG. 4A is a cross-sectional view illustrating a matching circuit component 16a according to a first variation. The signal line 22 of the matching circuit component 16a has a trapezoidal shape as in FIG. 2A. The substrate 20 of the matching circuit component 16a is a multilayer substrate having a plurality of insulator layers 50 to 53 and metal layers 54a to 54c. The insulator layers 50 to 53 are stacked in order from the bottom, and adjacent insulator layers are joined to each other. The metal layer 24 is provided on the lower surface 20d of the insulator layer 50. The metal layer 54a is provided between the insulator layer 50 and the insulator layer 51. the metal layer 54b is provided between the insulator layer 51 and the insulator layer 52. The metal layer 54c is provided between the insulator layer 52 and the insulator layer 53. The signal line 22 is provided on the upper surface 20c of the insulator layer 53.

A distance T5 (the thickness of the substrate 20) from the signal line 22 to the metal layer 24 is, for example, 1 mm. A distance T6 (the total thickness of the insulator layers 51 to 53) from the signal line 22 to the metal layer 54a is smaller than the distance T5, e.g., 0.75 mm. A distance T7 (the total thickness of the insulator layers 52 to 53) from the signal line 22 to the metal layer 54b is smaller than the distance T6, e.g., 0.5 mm. A distance T8 (the thickness of the insulator layer 53) from the signal line 22 to the metal layer 54c is smaller than the distance T7, for example, 0.25 mm.

Figure 4B:
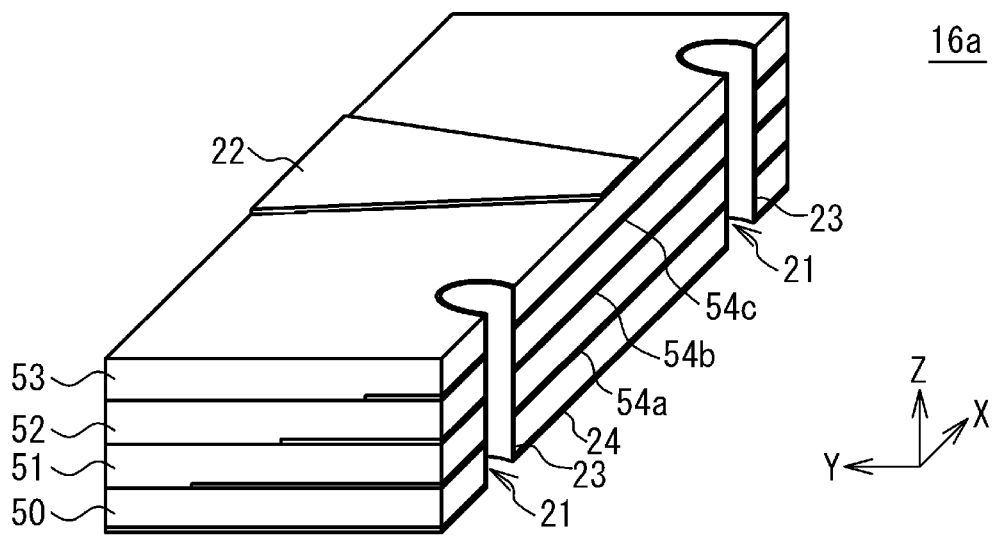
FIG. 4B is a perspective view illustrating the matching circuit component.

FIG. 4B is a perspective view illustrating the matching circuit component 16. Via holes 21 penetrating the substrate 20 in the Z-axis direction are provided. A metal layer 23 is provided on an inner wall of each via hole 21. The metal layers 24 and 54a-54c are electrically connected to each other by the metal layer 23 and have a reference potential (ground potential). The signal line 22 is separated from the metal layers 24 and 54a to 54c.

As illustrated in FIG. 4A, the signal line 22, the metal layer 24 and the metal layers 54a to 54c extend in the Y-axis direction. One end of each of the signal line 22, the metal layer 24 and the metal layers 54a to 54c (a right end in FIG. 4A) is located on the surface 20b of the substrate 20. The other end of each of the signal line 22 and the metal layer 24

(the left end in FIG. 4A) is located on the surface 20a. The other end of the metal layer 54a is located between the surfaces 20a and 20b. The other end of the metal layer 54b is located between the other end of the metal layer 54a and the surface 20b. The other end of the metal layer 54c is located between the other end of the metal layer 54b and the surface 20b. The ends on the surface 20a side of the metal layers 24, 54a, 54b, and 54c approach the surface 20b in this order.

According to the first variation, the characteristic impedance Za on the surface 20a side of the microstrip line is substantially the same as the characteristic impedance Zb on the surface 20b side, as in the first embodiment. The phase change of the high frequency signal is suppressed, and the loss is suppressed. The number of insulator layers included in the substrate 20 may be four or more, or four or less. The number of metal layers may be 3 or more, or 3 or less. Since it is not necessary to form slopes and steps in the insulators and the metal layers, the matching circuit component 16a can be easily manufactured.

(Second Variation)

Figure 4C:
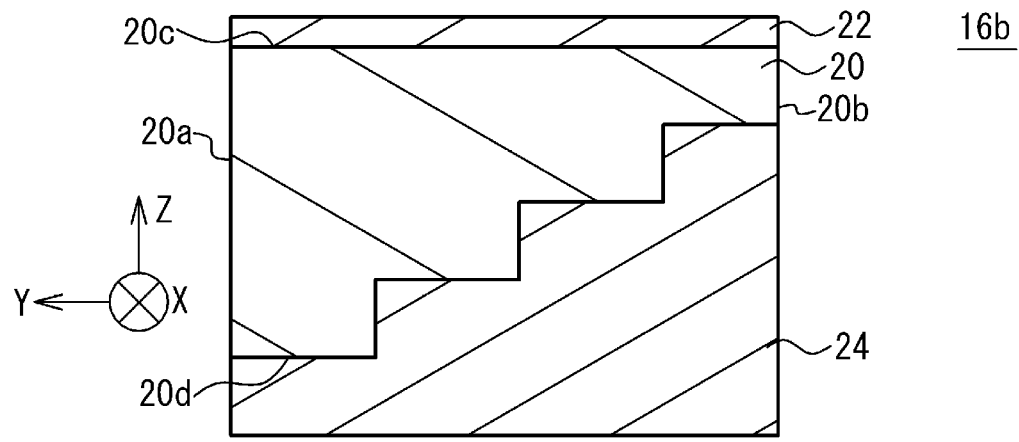
FIG. 4C is a cross-sectional view illustrating the matching circuit component according to a second variation.

FIG. 4C is a cross-sectional view illustrating a matching circuit component 16b according to a second variation. The surface 20d of the substrate 20 of the matching circuit component 16b has a step shape, and gradually approaches the surface 20c from the surface 20a side to the surface 20b side. The metal layer 24 has a step shape corresponding to the surface 20d.

According to the second variation, the characteristic impedance Za on the surface 20a side of the microstrip line is substantially the same as the characteristic impedance Zb on the surface 20b side, as in the first embodiment. The phase change of the high frequency signal is suppressed, and the loss is suppressed. Any one of the substrate 20 and the metal layer 24 may have the slope and the other may have the step shape. A space between the substrate 20 and the metal layer 24 is filled with a conductive adhesive, so that the substrate 20 and the metal layer 24 are adhered to each other.

Second Embodiment (Semiconductor Device)

Figure 5A:
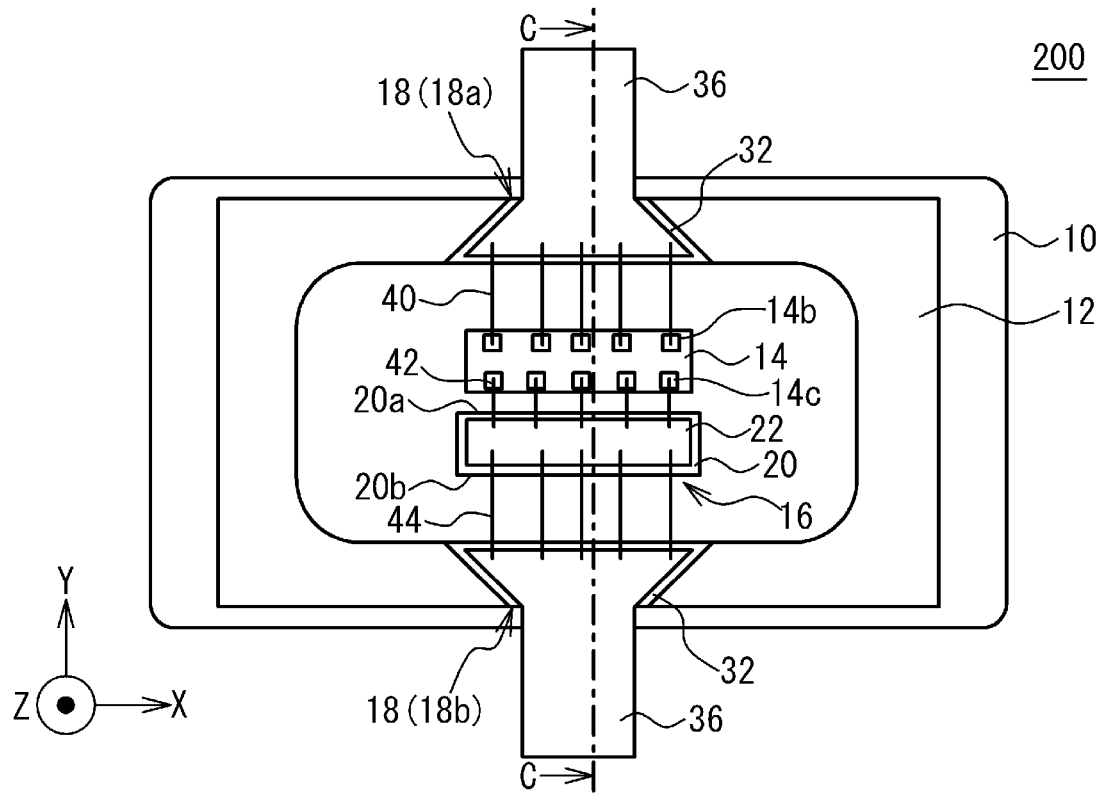
FIG. 5A is a plan view illustrating the semiconductor device according to a second embodiment.

FIG. 5A is a plan view illustrating a semiconductor device 200 according to a second embodiment. The description of the same configuration as that of the first embodiment will be omitted. As illustrated in FIG. 5A, a planar shape of the signal line 22 of the matching circuit component 16 is, for example, a rectangle, and the width of the signal line 22 is constant from the surface 20a side to the surface 20b side. The planar shape of the signal line 32 of the feedthrough 18 is trapezoidal. The width on the transistor 14 side of the signal line 32 is larger than the width on the opposite side (the tip side of the lead 36). A portion of the lead 36 that contacts the upper surface of the signal line 32 is trapezoidal like the signal line 32.

The respective bonding wires 40, 42, and 44 extend in the Y-axis direction. The lengths of the plurality of bonding wires 40 are equal to each other. The lengths of the plurality of bonding wires 42 are equal to each other. The lengths of the plurality of bonding wires 44 are equal to each other.

Figure 5B:
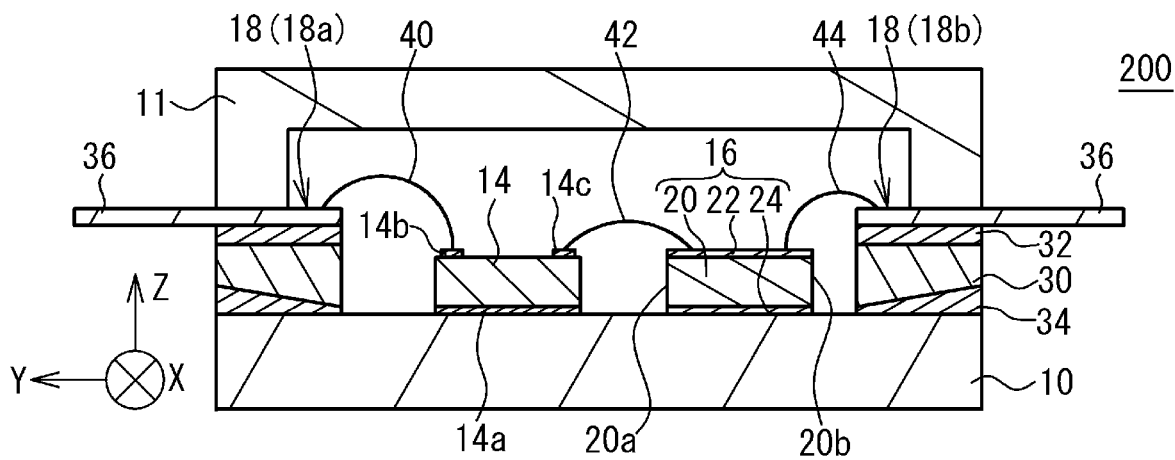
FIG. 5B is a cross-sectional view taken along a line C-C of FIG. 5A.

FIG. 5B is a cross-sectional view taken along a line C-C of FIG. 5A. As illustrated in FIG. 5B, the upper and lower surfaces of the substrate 20 of the matching circuit component 16 are parallel to the upper surface of the base 10, and the thickness of the substrate 20 is constant. The thickness of the metal layer 24 is also constant. A lower surface of the substrate 30 of the feedthrough 18 is inclined and approaches an upper surface thereof from the transistor 14 side to the tip end side of the lead 36. The metal layer 34 is inclined depending on the substrate 30.

Figure 6:
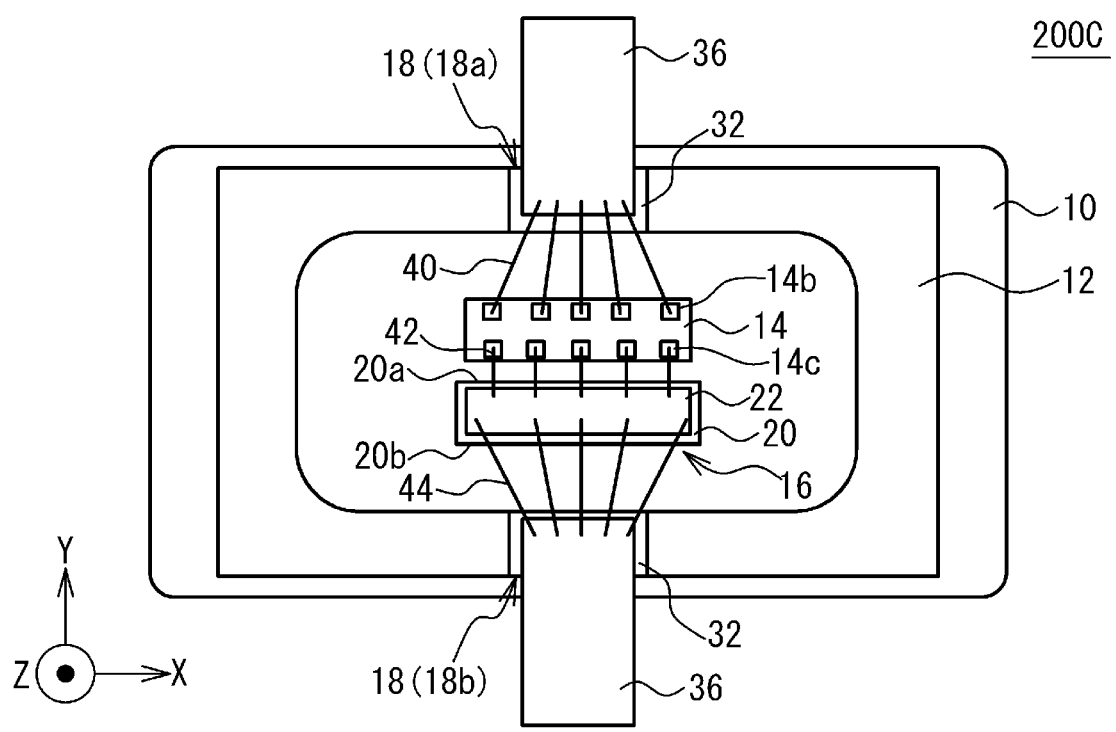
FIG. 6 is a plan view illustrating the semiconductor device according to a second comparative example.

FIG. 6 is a plan view illustrating a semiconductor device 200C according to a second comparative example. The signal line 32 and the lead 36 of the feedthrough 18 are rectangular, and the widths thereof are constant. A cross section of the semiconductor device 200C is the same as that of the semiconductor device 100C illustrated in FIG. 3, and a distance between the signal line 32 and the metal layer 34 of the feedthrough 18 is constant. The characteristic impedance on the transistor 14 side of the feedthrough 18 is equal to the characteristic impedance on the opposite side.

As illustrated in FIG. 6, the outer ones in the X-axis direction among the bonding wires 40 and 44 extend obliquely with respect to the Y-axis direction. The ones in the center in the X-axis direction among the bonding wires 40 and 44 extend in the Y-axis direction. The outer ones among the plurality of bonding wires 40 are longer than the central one. The outer ones among the plurality of bonding wires 44 are longer than the central one. The phases of the high frequency signals are shifted in the X-axis direction due to the difference in the lengths of the bonding wires, resulting in an increase in the loss.

In the second comparative example, the width of a portion of the signal line 32 increases as illustrated in FIG. 5A, so that the lengths of the plurality of bonding wires 40 and the lengths of the plurality of bonding wires 44 can be made constant. However, the change in the width of the signal line 32 causes the characteristic impedance on the transistor 14 side of the feedthrough 18 to be lower than the characteristic impedance on the opposite side.

According to the second embodiment, the width on the transistor 14 side of the signal line 32 is larger than the width on the opposite side as illustrated in FIG. 5A. Therefore, the lengths of the plurality of bonding wires 40 can be made constant, and the lengths of the plurality of bonding wires 44 can be made constant. The loss of the high frequency signal can be suppressed. As illustrated in FIG. 5B, the lower surface of the substrate 30 of the feedthrough 18 is inclined. The distance between the signal line 32 and the metal layer 34 of the feedthrough 18 on the transistor 14 side is larger than the distance on the opposite side. Therefore, the characteristic impedance on the transistor 14 side of the feedthrough 18 is substantially the same as the characteristic impedance on the opposite side of the feedthrough 18. The loss of the high frequency signal is suppressed.

The substrate 30 of the feedthrough 18 may be a multilayer substrate as illustrated in FIGS. 4A and 4B. The substrate 30 and the metal layer 34 may be provided with steps as illustrated in FIG. 4C.

Embodiments according to the present disclosure have been described above. However, the present disclosure is not limited to the embodiment described above, and various modifications and changes can be made to the present disclosure within the scope of the gist of the present disclosure described in the Claims.

REFERENCE SIGNS LIST 10 base
11 lid
12 frame body
14 transistor
14a, 14b, 14c pad
16, 16a, 16b matching circuit component 18, 18a, 18b feedthrough
20 substrate
20a, 20b, 20c, 20d surface
21 via hole
22, 32 signal line
23, 24, 34, 54a to 54c metal layer
36 lead
40, 42, 44 bonding wire
50, 51, 52, 53 insulator layer
100, 100C, 200, 200C semiconductor device

The invention claimed is:

1. A semiconductor device comprising:
a base;
a matching circuit including;
a rectangular substrate provided on the base and including an insulator;
a ground layer provided on the substrate;
a signal line provided on a first surface of the substrate and separated from the ground layer;
wherein a width of the signal line on a first end side of the substrate is smaller than a width of the substrate and larger than a width of the signal line on a second end side of the substrate, and a distance between the ground layer and the signal line on the first end side is larger than a distance between the ground layer and the signal line on the second end side,
a semiconductor element provided on the base and electrically connected to the signal line on the first end side of the matching circuit by a plurality of first bonding wires,
a frame body provided on the base and surrounding the semiconductor element and the matching circuit;
a feedthrough provided on the frame body and having a lead; and
a plurality of second bonding wires electrically connected to the lead of the feedthrough and the signal line on the second end side of the matching circuit;
wherein the plurality of first bonding wires are arranged in parallel with each other, and the plurality of second bonding wires are arranged in parallel with each other.

2. The semiconductor device according to claim 1, wherein
the ground layer is provided on a second surface of the substrate which is located on an opposite side of the first surface.

3. The semiconductor device according to claim 2, wherein
the second surface of the substrate is inclined to approach the first surface from the first end side of the substrate to the second end side of the substrate.

4. The semiconductor device according to claim 2, wherein
the second surface of the substrate has a step that approaches the first surface from the first end side of the substrate to the second end side of the substrate.

5. The transmission component semiconductor device according to claim 1, wherein
the substrate includes a plurality of stacked insulator layers,
the ground layer includes a first metal layer provided on a second surface of the substrate which is located on an opposite side of the first surface, and a second metal layer provided between the plurality of insulator layers, and
an end portion of the second metal layer on the first end side of the substrate is located closer to the second end side of the substrate than an end portion of the first metal layer on the first end side of the substrate.

6. The semiconductor device according to claim 5, wherein
the ground layer includes a plurality of stacked second metal layers,
an end portion of one of the second metal layers on the first end side of the substrate is located closer to the second end of the substrate than an end portion of another one of the second metal layers on the first end side of the substrate, the one of the second metal layers being closer to the signal line in a stacking direction of the plurality of insulator layers, the another one of the second metal layers being farther from the signal line in the stacking direction.

7. The semiconductor device according to claim 1, wherein
an interval between the plurality of first bonding wires is wider than an interval between the plurality of second bonding wires.

8. The semiconductor device according to claim 1, wherein
the lengths of the plurality of first bonding wires are the same as each other, and the lengths of the plurality of second bonding wires are the same as each other.

9. A semiconductor device comprising:
a semiconductor element provided on a base;
a feedthrough provided on a frame body and having a ground layer, and a lead provided on a signal line;
wherein the semiconductor element is electrically connected to the signal line through the lead by a plurality of first bonding wires,
a width of the signal line on a semiconductor element side is larger than a width of the signal line on an opposite side of the semiconductor element side,
a distance between the ground layer and the signal line on the semiconductor element side is larger than a distance between the ground layer and the signal line on the opposite side of the semiconductor element side, and
the lengths of the plurality of first bonding wires are the same as each other.

* * * * *